(12) United States Patent
Fang et al.

(10) Patent No.: US 11,309,227 B2
(45) Date of Patent: Apr. 19, 2022

(54) CHIP PACKAGE STRUCTURE HAVING A PACKAGE SUBSTRATE DISPOSED AROUND A DIE

(71) Applicant: Huawei Technologies Co., Ltd., Shenzhen (CN)

(72) Inventors: Jianping Fang, Beijing (CN); Yanqin Liao, Xi'an (CN); Haohui Long, Beijing (CN); Hui Si, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 63 days.

(21) Appl. No.: 16/757,012

(22) PCT Filed: Oct. 20, 2017

(86) PCT No.: PCT/CN2017/107030
§ 371 (c)(1),
(2) Date: Apr. 17, 2020

(87) PCT Pub. No.: WO2019/075720
PCT Pub. Date: Apr. 25, 2020

(65) Prior Publication Data
US 2020/0273770 A1    Aug. 27, 2020

(51) Int. Cl.
*H01L 23/31* (2006.01)
*G06K 9/00* (2022.01)
(Continued)

(52) U.S. Cl.
CPC ........ *H01L 23/3185* (2013.01); *G06K 9/0004* (2013.01); *H01L 21/566* (2013.01);
(Continued)

(58) Field of Classification Search
CPC ... H01L 21/566; H01L 23/3185; H01L 23/31; H01L 23/49838; H01L 2224/13022;
(Continued)

(56) References Cited

U.S. PATENT DOCUMENTS

| 7,370,411 | B2 | 5/2008 | Yamano |
| 7,944,039 | B2 | 5/2011 | Arai |

(Continued)

FOREIGN PATENT DOCUMENTS

| CN | 1779931 A | 5/2006 |
| CN | 2935472 Y | 8/2007 |

(Continued)

*Primary Examiner* — Khiem D Nguyen
(74) *Attorney, Agent, or Firm* — Slater Matsil, LLP

(57) ABSTRACT

A chip package structure and a chip package method, the chip package structure including a die and a package substrate disposed around the die. A solder joint is disposed on a first surface of the die. Remaining surfaces of the die other than a second surface are wrapped by an injection molding material. At least one pair of opposite sides of the package substrate is embedded in the injection molding material. A contact area between the pair of opposite sides and the injection molding material accounts for more than half of a surface area of the pair of opposite sides. The second surface is a surface that is of the die and that is opposite to the first surface.

6 Claims, 10 Drawing Sheets

US 11,309,227 B2
Page 2

(51) Int. Cl.
*H01L 21/56* (2006.01)
*H01L 23/498* (2006.01)
*H01L 23/00* (2006.01)

(52) U.S. Cl.
CPC ........ *H01L 23/49838* (2013.01); *H01L 24/13* (2013.01); *H01L 2224/13022* (2013.01); *H01L 2924/3511* (2013.01)

(58) Field of Classification Search
CPC ................. H01L 2224/96; H01L 24/13; H01L 2924/3511; H01L 2924/18162; H01L 2924/3512; H01L 2224/16227; G06K 9/00053; G06K 9/0004
USPC ....................................................... 257/668
See application file for complete search history.

(56) References Cited

U.S. PATENT DOCUMENTS

| | | | |
|---|---|---|---|
| 9,202,769 B2 | 12/2015 | Lin et al. | |
| 9,396,999 B2 | 7/2016 | Yap et al. | |
| 2001/0001989 A1* | 5/2001 | Smith | H01L 23/49816 174/565 |
| 2014/0091454 A1 | 4/2014 | Lin et al. | |
| 2015/0123275 A1 | 5/2015 | Yamada et al. | |
| 2015/0382469 A1* | 12/2015 | Hu | H05K 1/187 361/761 |
| 2016/0005628 A1 | 1/2016 | Yap et al. | |
| 2016/0343634 A1 | 11/2016 | Erhart et al. | |
| 2017/0142834 A1 | 5/2017 | Hsieh et al. | |
| 2017/0148744 A1* | 5/2017 | Carson | H01L 21/561 |
| 2017/0287604 A1* | 10/2017 | Kawabata | H01L 23/552 |
| 2017/0287851 A1* | 10/2017 | Prakash | H01L 21/56 |

FOREIGN PATENT DOCUMENTS

| | | | | |
|---|---|---|---|---|
| CN | 202633285 U | 12/2012 | | |
| CN | 103887251 A | 6/2014 | | |
| CN | 103904044 A | 7/2014 | | |
| CN | 106485236 A | 3/2017 | | |
| CN | 107123602 A | 9/2017 | | |
| CN | 107123602 B | * 6/2019 | ....... | H01L 23/49503 |
| JP | 2011108892 A | 6/2001 | | |
| JP | 2006261245 A | 9/2006 | | |
| JP | 2009252859 A | 10/2009 | | |
| JP | 4904769 B2 | 3/2012 | | |
| JP | 2015153853 A | 8/2015 | | |
| KR | 100818546 B1 | 4/2008 | | |
| TW | 201316462 A | 4/2013 | | |

* cited by examiner

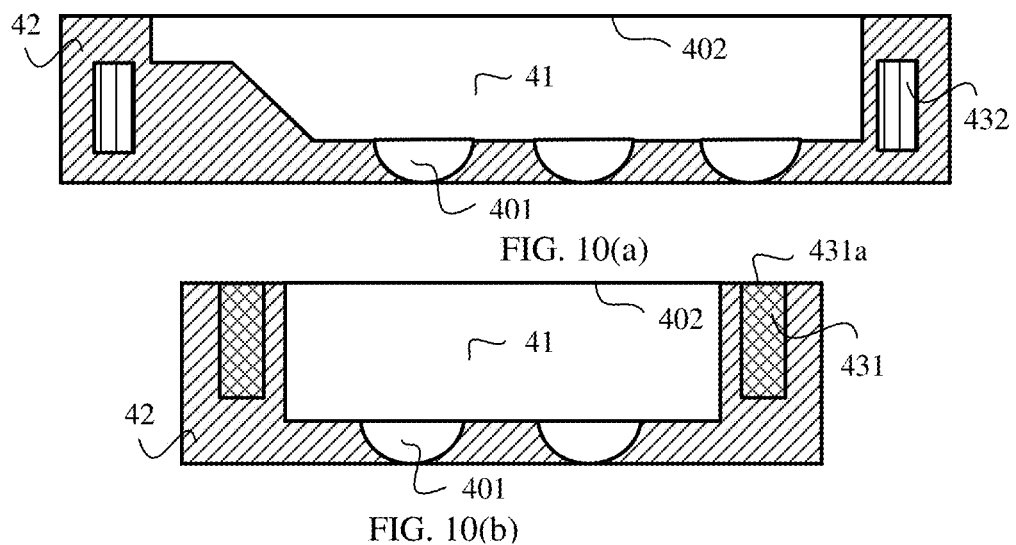
FIG. 10(a)
FIG. 10(b)
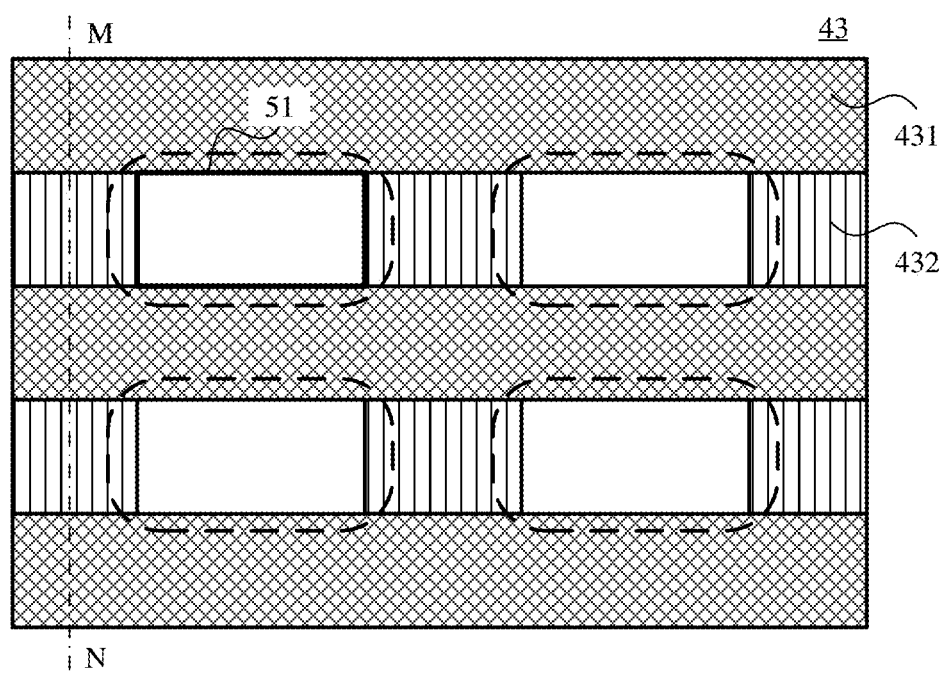
FIG. 11

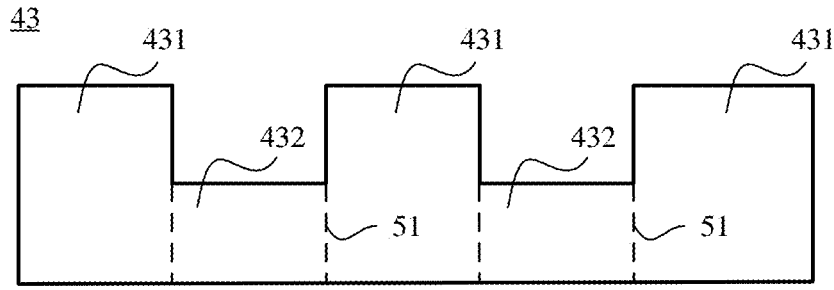

FIG. 12

| Place a die 41 in a through hole 51 of a second substrate 432, where a first substrate 431 is flush with a second surface of the die 41, and the second surface is a surface that is of the die 41 and that is opposite to a first surface on which a solder joint is disposed | — 101 |

| Form a packaging film on the first substrate 431 and the second surface that are flush with each other | — 102 |

| Inject an injection molding material into the through hole 51 of the second substrate 432, and the packaging material covers each surface of the die 41 except the second surface | — 103 |

| Remove the packaging film formed on the first substrate 431 and the second surface | — 104 |

| Cut the packaged package substrate 43 to obtain packaged individual chips | — 105 |

CHIP PACKAGE STRUCTURE HAVING A PACKAGE SUBSTRATE DISPOSED AROUND A DIE

CROSS REFERENCE TO RELATED APPLICATIONS

This application is a national stage of International Application No. PCT/CN2017/107030, filed on Oct. 20, 2017, which is hereby incorporated by reference in its entirety.

TECHNICAL FIELD

Embodiments of this application relate to the field of electronic technologies, and in particular, to a chip package structure and a chip package method

BACKGROUND

A chip, also referred to as a microcircuit, a microchip, or an integrated circuit (IC), is a silicon chip including an integrated circuit, and is usually a part of a terminal such as a mobile phone or a computer. For example, a fingerprint chip may be disposed in the mobile phone to implement fingerprint-related functions such as fingerprint image collection, fingerprint feature extraction, and fingerprint feature comparison, or a display chip may be disposed to implement a display function of a display screen of the terminal.

Generally, after being fabricated, a die can only be normally used as a chip after a packaging process. However, because a user asks for a lighter and thinner terminal, a requirement of a package thickness for die packaging becomes more and more demanding. The fingerprint chip is used as an example. Currently, a package thickness of the fingerprint chip needs to be 300 um or less. As shown in FIG. 1, a die 11 may be packaged by using a through silicon via (TSV) packaging process. To reduce the package thickness, an injection molding material 12 is usually not molded on an upper surface of the die 11, but a solder joint 13 for transmitting an electrical signal by a user is disposed on a lower surface of the die 11. When the die 11 is being packaged, the injection molding material 12 may be injected around the die 11 and on the lower surface of the die 11, and the solder joint 13 is exposed.

However, because the upper surface of the die 11 is not wrapped with the injection molding material 12, when the fingerprint chip is being packaged, the die 11 and the injection molding material 12 shrink at a high temperature or in another condition, and a shrinkage degree of the injection molding material 12 with relatively low strength is greater than a shrinkage degree of the die 11. Consequently, a package structure of the entire die 11 presents a warpage phenomenon that the middle is higher and the surrounding is lower, affecting a degree of subsequent attachment between the fingerprint chip and another component.

SUMMARY OF THE INVENTION

Embodiments of this application provide a chip package structure and a chip package method, to alleviate warpage generated during chip packaging.

To achieve the foregoing objective, the following technical solutions are used in the embodiments of this application.

According to a first aspect, an embodiment of this application provides a chip package structure. The chip package structure includes a die and a package substrate disposed around the die, where a solder joint is disposed on a first surface of the die, remaining surfaces of the die other than a second surface (the second surface is a surface that is of the die and that is opposite to the first surface) are wrapped by an injection molding material, at least one pair of opposite sides of the package substrate is embedded in the injection molding material, and a contact area between the pair of opposite sides and the injection molding material accounts for more than half of a surface area of the pair of opposite sides.

In this way, because the package substrate embedded in the injection molding material is symmetrically disposed around the die, the die can be fastened and strengthened, thereby alleviating warpage that occurs when the die is being packaged.

In addition, because the package substrate is inserted into the injection molding material in an embedded form, a buckle structure with relatively high stability may be formed with the injection molding material, thereby avoiding a problem that the package substrate is separated or detached from the injection molding material. In addition, after the package substrate is embedded in the injection molding material, a contact area between the package substrate and the injection molding material is correspondingly increased, and adhesion between the package substrate and the injection molding material is further increased, thereby improving stability and reliability of the entire chip package structure.

In a possible design method, the package substrate includes a first pair of opposite sides and a second pair of opposite sides, and a length of the first pair of opposite sides is greater than a length of the second pair of opposite sides. The second pair of opposite sides is embedded in the injection molding material, so that at least three surfaces of the second pair of opposite sides are in contact with the injection molding material, to form a buckle structure with relatively high stability, thereby reducing a probability of separating the packaging substrate from the injection molding material. In addition, because there is a relatively high probability that the warpage occurs near a short side of the die, embedding the second pair of opposite sides along the injection molding material that is near the short side of the die can effectively reduce the probability that the warpage occurs.

In a possible design method, the first pair of opposite sides is also embedded in the injection molding material, so that at least three surfaces of the first pair of opposite sides are in contact with the injection molding material. In this case, the two pairs of opposite sides of the package substrate are embedded in the injection molding material and encircle the die, so that warpage and separation of the package structure can be alleviated to the greatest extent.

In a possible design method, a height of the first pair of opposite sides in a target direction (the target direction is perpendicular to the second surface of the die) is greater than a height of the second pair of opposite sides in the target direction. In addition, a first target surface of the first pair of opposite sides (the first target surface is a surface that is of the first pair of opposite sides and that is not in contact with the injection molding material in the target direction) is flush with a second surface of the die. In this case, a pair of opposite sides of the package substrate that is relatively short is embedded in the injection molding material, and a pair of opposite sides of the package substrate that is relatively long is not embedded in the injection molding material, but expose the first target surface that is flush with the second surface. When the chip package structure is fabricated, the pair of opposite sides that is relatively long facilitates disposing of a packaging film on the second surface of the die, preventing the injection molding material from covering the second surface of the die when the injection molding material is injected.

In a possible design method, the package substrate includes a first pair of opposite sides and a second pair of opposite sides, and a length of the first pair of opposite sides is greater than a length of the second pair of opposite sides. The first pair of opposite sides is embedded in the injection molding material, so that at least three surfaces of the first pair of opposite sides are in contact with the injection molding material, to form a buckle structure with relatively high stability, thereby reducing a probability of separating the packaging substrate from the injection molding material.

In a possible design method, a height of the second pair of opposite sides in a target direction is greater than a height of the first pair of opposite sides in the target direction, and a second target surface of the second pair of opposite sides is flush with the second surface of the die. The target direction is perpendicular to the second surface of the die, and the second target surface is a surface that is of the second pair of opposite sides and that is not in contact with the injection molding material in the target direction.

In a possible design method, a ratio of a contact area between the package substrate and the injection molding material to a surface area of the package substrate is greater than ⅔, ¾, or ⅘.

In a possible design method, the package substrate is generated by using an integrated molding process.

According to a second aspect, an embodiment of this application provides a chip package method, where the method is applied to a process of packaging a die by using a package substrate. The package substrate includes a first substrate and a second substrate that are disposed at an interval. A height of the first substrate in a target direction is higher than a height of the second substrate in the target direction. A through hole used to place the die is disposed on the second substrate. The target direction is the same as a hole depth direction of the through hole.

The method includes placing the die in the through hole of the second substrate, so that a second surface of the die is flush with a target surface of the first substrate, where the second surface is a surface that is of the die and that is opposite to a first surface on which a solder joint is disposed, and the target surface is a surface that is of the first substrate and that is higher than the second substrate in the target direction, forming a packaging film on the first substrate and the second surface of the die that are flush with each other, injecting an injection molding material into the through hole of the second substrate, so that the injection molding material fills gaps formed between the packaging film, the die, and the packaging substrate, and removing the packaging film formed on the first substrate and the second surface of the die.

In a possible design method, after the removing the packaging film formed on the first substrate and the second surface of the die, the method further includes cutting the packaging substrate along a cutting boundary line preset around the through hole, to obtain a packaged chip that includes the die.

In a possible design method, the removing the packaging film formed on the first substrate and the second surface of the die includes removing, by using a heating and stripping process, the packaging film formed on the first substrate and the second surface of the die.

In a possible design method, a projection area of the through hole in the target direction is greater than a projection area of the die in the target direction.

In a possible design method, the solder joint of the die is exposed outside the injection molding material.

According to a third aspect, an embodiment of this application provides a terminal, including the chip package structure according to any one of the foregoing aspects, a processor, a memory, a bus, and a communications interface. The memory is configured to store a computer executable instruction. The processor and the memory are connected by using the bus. When the terminal runs, the processor may execute the computer executable instruction stored in the memory.

In the embodiments of this application, names of the components in the chip package structure constitute no limitation on the chip package structure. In an actual implementation, the components may have other names. Any component whose function is similar to that in the embodiments of this application falls within the scope of protection defined by the claims and their equivalent technologies of this application.

In addition, for technical effects brought by any design in the second aspect to the third aspect, refer to technical effects brought by different design methods in the first aspect. Details are not described herein.

BRIEF DESCRIPTION OF THE DRAWINGS

FIG. 10(a) and FIG. 10(b) are a schematic diagram 7 of a chip package structure according to an embodiment of this application;

FIG. 11 is a schematic structural diagram 1 of a package substrate according to an embodiment of this application;

FIG. 12 is a schematic structural diagram 2 of a package substrate according to an embodiment of this application;

FIG. 13 is a flowchart of a chip package method according to an embodiment of this application;

DETAILED DESCRIPTION OF ILLUSTRATIVE EMBODIMENTS

The terms "first" and "second" mentioned below are merely intended for description, and shall not be understood as an indication or implication of relative importance or implicit indication of a quantity of indicated technical features. Therefore, a feature limited by "first" or "second" may explicitly or implicitly include one or more features. In the descriptions of embodiments of this application, unless otherwise stated, "a plurality of" means two or more than two.

Figure 1:
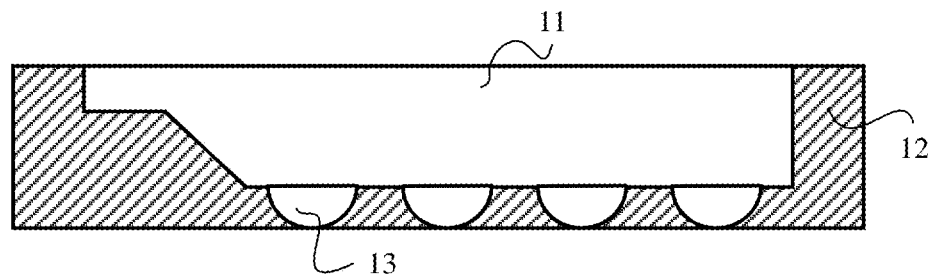
FIG. 1 is a schematic diagram 1 of a package structure of a die in the prior art.
Figure 2:
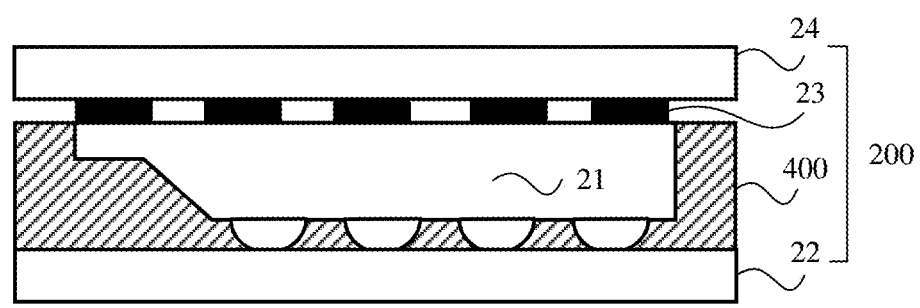
FIG. 2 is a schematic structural diagram of a fingerprint module in the prior art.

The embodiments of this application provide a chip package method and a chip package structure, which may be applied to production and use processes of various chips in a terminal. A fingerprint chip is used as an example. Referring to a sectional view of a fingerprint module 200 shown in FIG. 2, a fingerprint chip 21 is packaged to form a chip package structure 400. A flexible plate 22, for example, an FPC flexible plate, is disposed on a side that includes a solder joint 201 and that is of the fingerprint chip 21, and is configured to communicate with a mainboard in the terminal. A fingerprint sensor 23 (for example, a photodiode or a phototriode) is disposed on another side (namely, an upper surface of the fingerprint chip 21 in FIG. 2) of the fingerprint chip 21, and is configured to collect a fingerprint of a user. The fingerprint sensor 23 is covered with a cover 24 used to protect the fingerprint sensor 23.

The fingerprint module 200 includes the chip package structure 400, the flexible plate 22, the fingerprint sensor 23, and the cover 24. When a finger of the user touches the cover 24, the fingerprint chip 21 may collect the fingerprint of the user by using the fingerprint sensor 23, and perform feature extraction and feature comparison on the collected fingerprint. Finally, a comparison result is sent to a component such as a processor in the mainboard by using the flexible plate 22, to implement corresponding fingerprint functions such as fingerprint unlock and fingerprint payment.

The cover 24 may be specifically made of a material such as glass, ceramic, sapphire, or stainless steel. This is not limited in this embodiment of this application.

To make the terminal as thin as possible, or to prevent the fingerprint module 200 from occupying space of another component (for example, a drive circuit of a display screen) in the terminal, a package thickness of the fingerprint chip 21 needs to be less than 300 um. In this case, due to a strength difference between the fingerprint chip 21 and a package material, when the fingerprint chip 21 is packaged at a high temperature or in another condition, warpage easily occurs in the package structure 400.

Figure 3A:
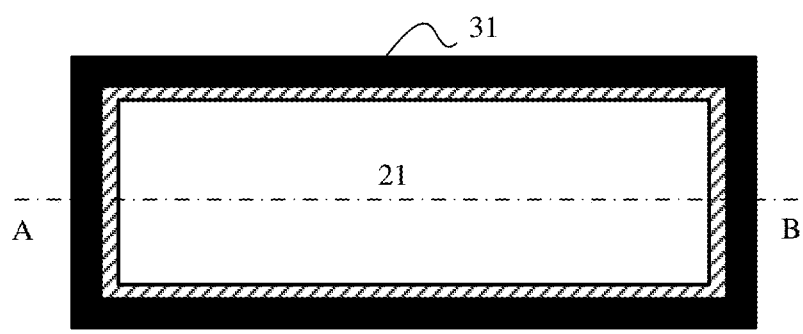
FIG. 3(a) and FIG. 3(b) are a schematic diagram 2 of a package structure of a die in the prior art.

In view of this, as shown in FIG. 3(a) (FIG. 3(a) is a top view of a package structure of the fingerprint chip 21), when the fingerprint chip 21 is being packaged, a substrate 31 may be added around the packaged fingerprint chip 21 to fasten the package structure of the entire fingerprint chip 21.

Figure 3B:
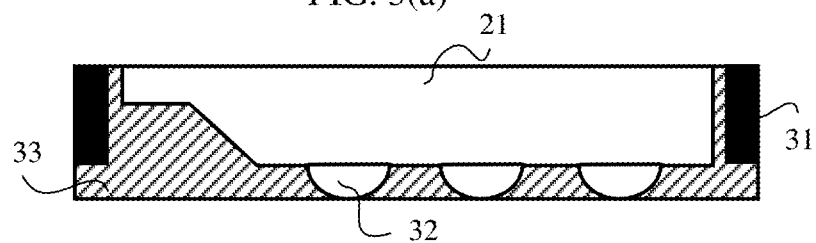

FIG. 3(b) is a cross-sectional view of the package structure of the fingerprint chip 21 shown in FIG. 3(a) along a line AB. Specifically, when the fingerprint chip 21 is being packaged, an injection molding material 33, for example, an EMC (epoxy molding compound), may be filled, in a cavity enclosed by the substrate 31, around the fingerprint chip 21 and on a lower surface of the fingerprint chip 21 on which a solder joint 32 is disposed, to obtain the packaged fingerprint chip 21.

Because a strength of the substrate 31 is greater than a strength of the injection molding material 33, the substrate 31 disposed around the fingerprint chip 21 may increase a strength of the entire package structure, so that the fingerprint chip 21 is not pulled to generate warpage when the injection molding material 33 shrinks under heat.

However, because a contact area between the substrate 31 and the injection molding material 33 is relatively small, and a material strength difference between the substrate 31 and the injection molding material 33 is relatively large, it is easy to cause the substrate 31 to be detached or separated from the injection molding material 33, thereby reducing stability and reliability of the entire package structure of the fingerprint chip 21.

Figure 4:
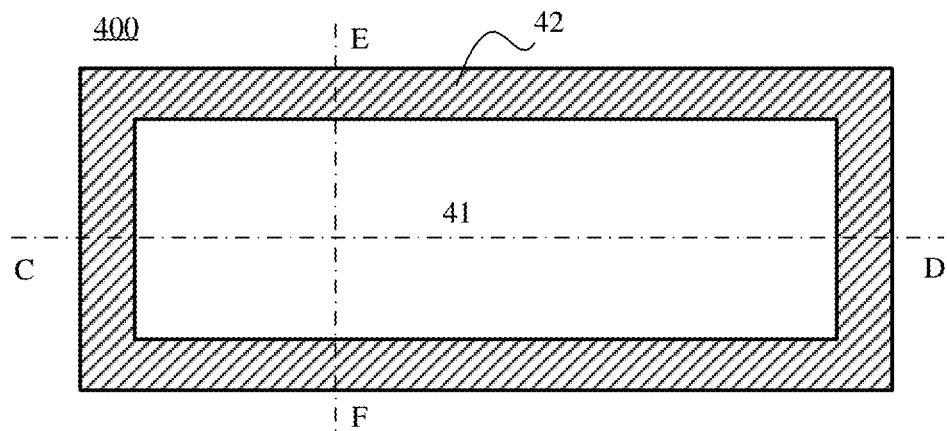
FIG. 4 is a schematic diagram 1 of a chip package structure according to an embodiment of this application.

In view of this, an embodiment of this application provides a chip package structure. FIG. 4 is a top view of the chip package structure 400. For a cross-sectional view of the chip package structure 400 along a line CD in FIG. 4, refer to FIG. 5.

Figure 5:
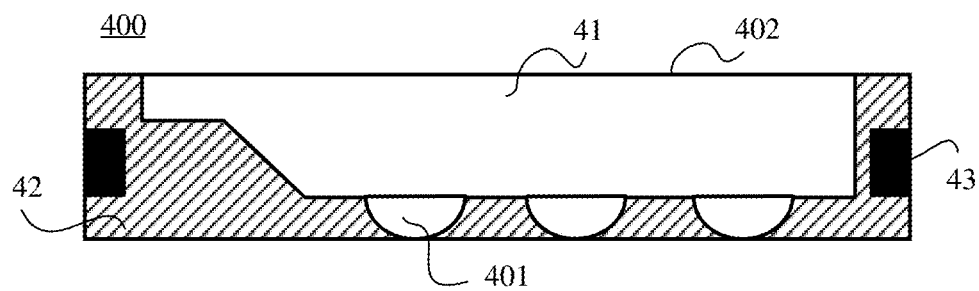
FIG. 5 is a schematic diagram 2 of a chip package structure according to an embodiment of this application.

Specifically, as shown in FIG. 5, the chip package structure 400 includes a die 41. A solder joint 401 is disposed on a first surface of the die 41. The die 41 is wrapped by an injection molding material 42, and at least one pair of opposite sides of a package substrate 43 is embedded in the injection molding material 42 that wraps around the die 41.

In this embodiment of this application, that "at least one pair of opposite sides of a package substrate 43 is embedded in the injection molding material 42" may be understood as that at least more than half of a surface area of the pair of opposite sides may be in contact with the injection molding material 42. For example, at least three surfaces of the package substrate 43 are in contact with the injection molding material 42. In other words, as shown in FIG. 5, at least one pair of opposite sides of the package substrate 43 may be embedded in the injection molding material 42, so that the package substrate 43 and the injection molding material 42 form a buckle structure with relatively high stability.

Still as shown in FIG. 5, the package substrate 43 embedded in the injection molding material 42 is symmetrically disposed around the die 41. Therefore, the die 41 can be fastened and strengthened, thereby alleviating warpage that occurs when the die 41 is being packaged.

In addition, because the package substrate 43 is inserted into the injection molding material 42 in an embedded form, a buckle structure with relatively high stability can be formed with the injection molding material 42, thereby avoiding separation or detachment between the package substrate 43 and the injection molding material 42. In addition, after the package substrate 43 is embedded in the injection molding material 42, a contact area between the package substrate 43 and the injection molding material 42 is correspondingly increased, and adhesion between the package substrate 43 and the injection molding material 42 is further increased, thereby improving stability and reliability of the chip package structure 400.

Optionally, still as shown in FIG. 5, the injection molding material 42 is not formed on a second surface 402 that is of the die 41 and that is opposite to the first surface. In this way, a thickness of the entire chip package structure 400 can be reduced, thereby meeting a design requirement of a lighter and thinner terminal.

Figure 6:
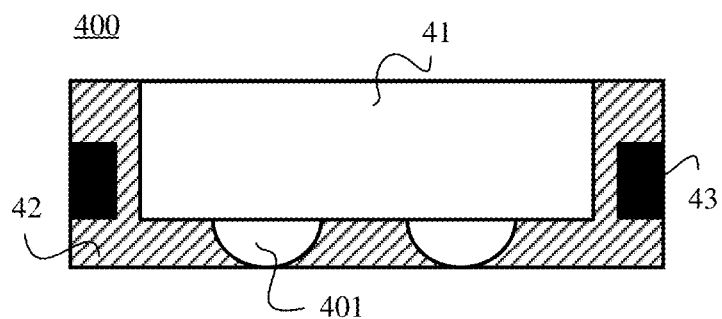
FIG. 6 is a schematic diagram 3 of a chip package structure according to an embodiment of this application.

Further, FIG. 6 is a cross-sectional view of the chip package structure 400 along a line EF in FIG. 4 (the line EF is perpendicular to the line CD). Similar to FIG. 5, the package substrate 43 may be embedded in the injection molding material 42 to increase a contact area with the injection molding material 42, and a buckle structure with relatively high stability is formed with the injection molding material 42, to avoid separation or detachment between the package substrate 43 and the injection molding material 42.

Figure 7:
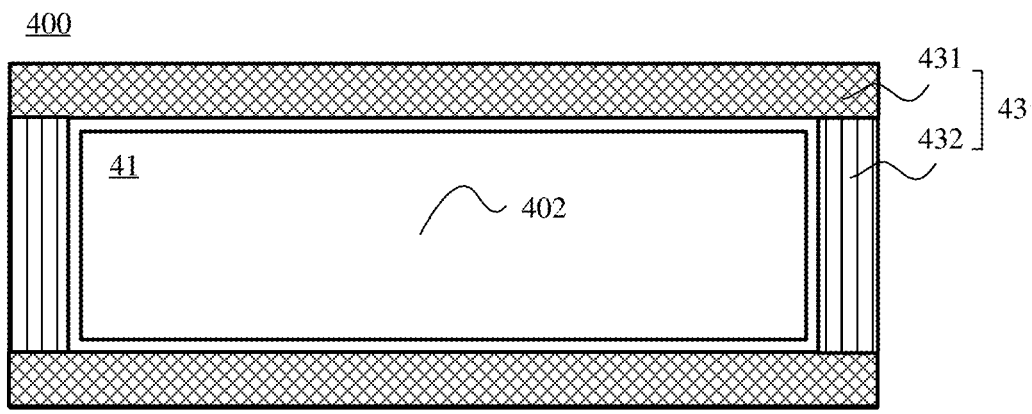
FIG. 7 is a schematic diagram 4 of a chip package structure according to an embodiment of this application.

Alternatively, a top view of the chip package structure 400 may be shown in FIG. 7. The package substrate 43 is divided into two parts. One part is a first substrate 431 that is flush with the second surface 402 of the die 41, and the other part is a second substrate 432 that is lower than the first substrate 431 in height. The first substrate 431 is disposed along a pair of opposite sides of the die 41, and the second substrate 432 is disposed along another pair of opposite sides of the die 41.

Figure 8:
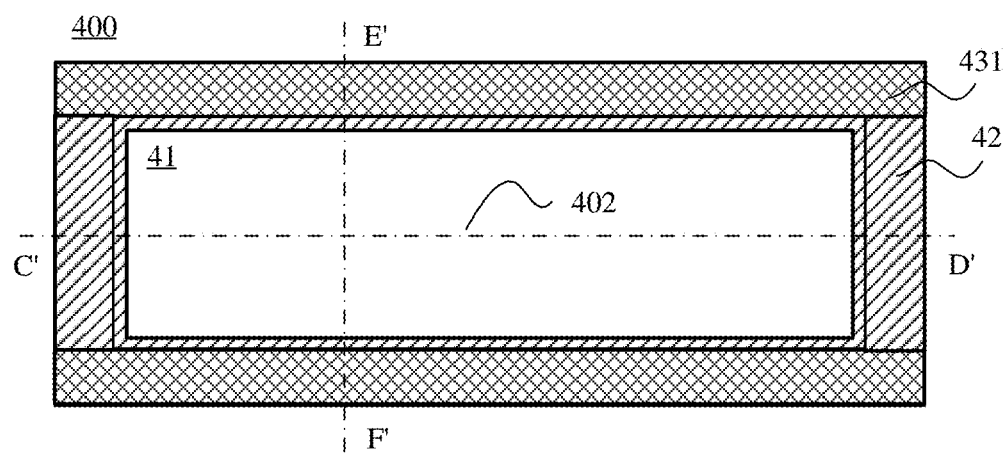
FIG. 8 is a schematic diagram 5 of a chip package structure according to an embodiment of this application.

Because the second substrate 432 is lower than the second surface 402 of the die 41, a gap is formed in an area around the die 41 and close to the second substrate 432. When the injection molding material 42 is subsequently injected, the injection molding material 42 is filled into the gap. In this case, a top view of the chip package structure 400 is shown in FIG. 8. A part lower than the second surface 402 of the die 41 is filled with the injection molding material 42.

Based on the chip package structure 400 shown in FIG. 8, a cross-sectional view along a longer side (a line C'D') of the die 41 in FIG. 8 is the same as FIG. 5. The second substrate 432 of the package substrate 43 is embedded in the injection molding material 42 that wraps around the die 41, to form a buckle structure with relatively high stability with the injection molding material 42, thereby avoiding separation or detachment between the package substrate 43 and the injection molding material 42.

Figure 9:
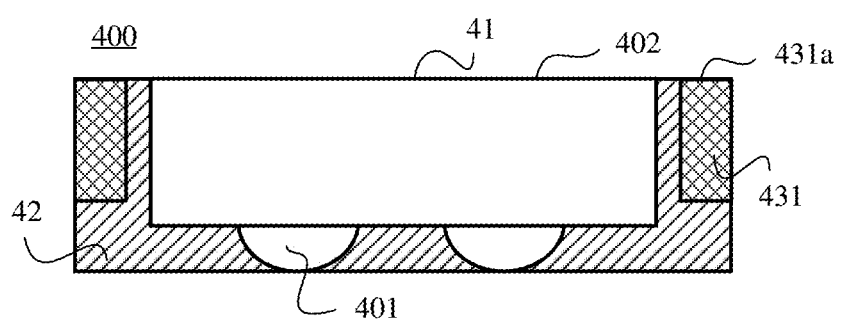
FIG. 9 is a schematic diagram 6 of a chip package structure according to an embodiment of this application.

In this case, for a cross-sectional view along a shorter side (a line E'F') of the die 41 in FIG. 8, refer to FIG. 9. Because the first substrate 431 in the package substrate 43 is flush with the second surface 402 of the die 41, the first substrate 431 is not embedded in the injection molding material 42 in a direction of the line E'F', but exposes a surface 431a that is flush with the second surface 402.

To be specific, in the chip package structure 400 shown in FIG. 7 to FIG. 9, the second substrate 432 may be embedded in a direction of the line C'D', to form a buckle structure with relatively high stability with the injection molding material 42, thereby improving stability of the package structure 400. The first substrate 431 is not embedded in the injection molding material 42 in the direction of the line E'F', but the first substrate 431 is flush with the second surface 402 of the die 41, which is helpful to dispose a packaging film on the first substrate 431 and the second surface 402 of the die 41 when the chip package structure 400 is fabricated, to prevent the injection molding material 42 from covering the second surface 402 of the die 41 when the injection molding material 42 is being injected.

Alternatively, the first substrate 431 that is flush with the second surface 402 of the die 41 may be disposed in the direction of the line C'D', and the second substrate 432 embedded in the injection molding material 42 may be disposed in the direction of the line E'F', to form a buckle structure with relatively high stability with the injection molding material 42, thereby improving the stability of the package structure 400. This is not limited in this embodiment of this application.

A method for fabricating the chip package structure 400 is described in detail in a subsequent embodiment, and details are not described herein again.

It should be noted that, in this embodiment of this application, no limitation is imposed on a specific location at which the package substrate 43 is embedded in the injection molding material 42 and a depth at which the package substrate 43 is embedded in the injection molding material 42. When the package substrate 43 is embedded in the injection molding material 42 more deeply, a ratio of the contact area between the package substrate 43 and the injection molding material 42 to a surface area of the package substrate 43 is larger. For example, the ratio may be specifically greater than ⅔, ¾, ⅘, or the like. A person skilled in the art may properly set the ratio based on actual experience or an actual application scenario. For example, based on the chip package structure 400 shown in FIG. 8 to FIG. 9, the injection molding material 42 may be further formed around the package substrate 43. In this case, FIG. 10(a) is a cross-sectional view of the chip package structure 400 in the direction of the line C'D'. It can be learned that the second substrate 432 of the package substrate 43 is completely wrapped in the injection molding material 42. FIG. 10(b) is a cross-sectional view of the chip package structure 400 in the direction of the line E'F'. In this case, only the surface 431a on the first substrate 431 of the package substrate 43 is exposed to the injection molding material 42, and other surfaces are embedded in the injection molding material 42.

Before the chip package method provided in the embodiments of this application is described, a package substrate 43 used to package the die 41 is first described.

As shown in FIG. 11, a plurality of chips (for example, fingerprint chips shown in FIG. 11) may be packaged at a time by using the package substrate 43. After the packaging is completed, each individual fingerprint chip (namely, a closed pattern formed by dashed lines in FIG. 11) may be obtained by cutting the package substrate 43.

Specifically, FIG. 11 is a top view of the package substrate 43 according to an embodiment of this application. The package substrate 43 may include two parts with different heights, namely, a protruded first substrate 431 and a recessed second substrate 432. A through hole 51 used to package the die 41 is disposed on the recessed second substrate 432, and an area of the through hole 51 is greater than an area of the die 41.

FIG. 12 is a cross-sectional view of the package substrate 43 along a line MN in FIG. 11. The first substrate 431 and the second substrate 432 of the package substrate 43 are arranged in a sawtooth shape. The through hole 51 used to package the die 41 is disposed on the second substrate 432.

In addition, the package substrate 43 may be specifically a paper substrate (for example, phenolic resin FR-1 or epoxy resin FE-3), a glass fiber substrate (for example, epoxy resin FR-4 or FR-5), a composite substrate, or the like. This is not limited in this embodiment of this application.

In addition, the first substrate 431 and the second substrate 432 that form the package substrate 43 may be formed by splicing a plurality of substrates, or may be fabricated at a time by using an integrated molding process. This is not limited in this embodiment of this application.

Based on the package substrate 43, a chip package method is provided according to an embodiment of this application. As shown in FIG. 13, the method includes the following steps.

101. Place the die 41 in the through hole 51 of the second substrate 432, where the first substrate 431 is flush with a second surface of the die 41, and the second surface is a surface that is of the die 41 and that is opposite to a first surface on which a solder joint is disposed.

Figure 14:
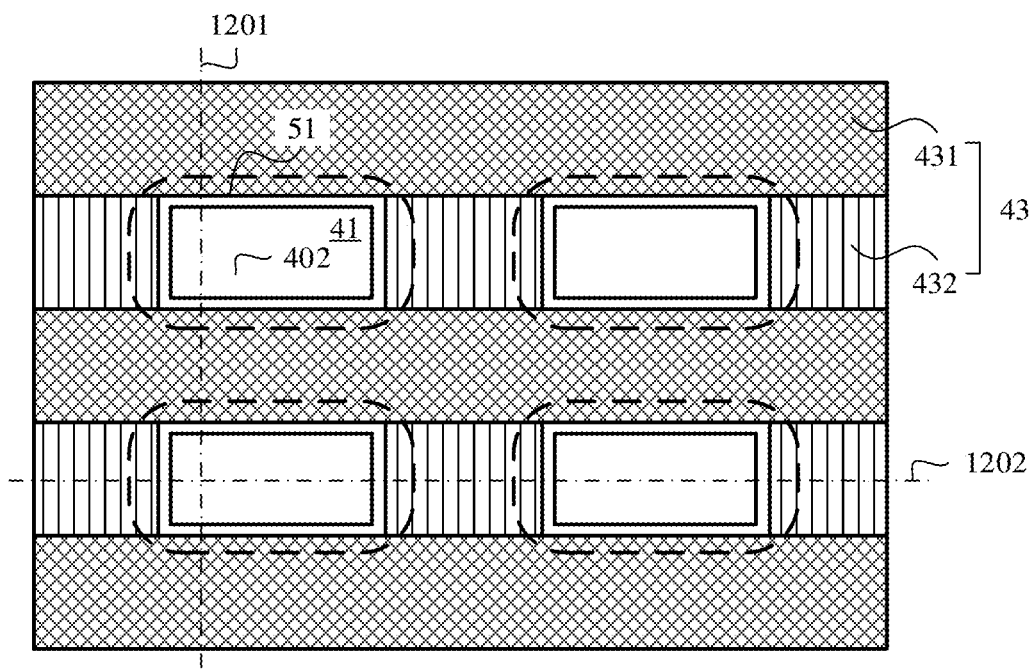
FIG. 14 is a schematic diagram 8 of a chip package structure according to an embodiment of this application.

Specifically, FIG. 14 is a top view of the package substrate 43 after the die 41 is placed. The through hole 51 is disposed on the second substrate 432 of the package substrate 43, and the area of the through hole 51 is greater than the area of the die 41. Therefore, the die 41 may be placed in the through hole 51. When the die 41 is placed, the second surface 402 of the die 41 is flush with the higher first substrate 431 of the package substrate 43, and the first surface, on which the solder joint is disposed, of the die 41 may protrude from the package substrate 43.

Figure 15:
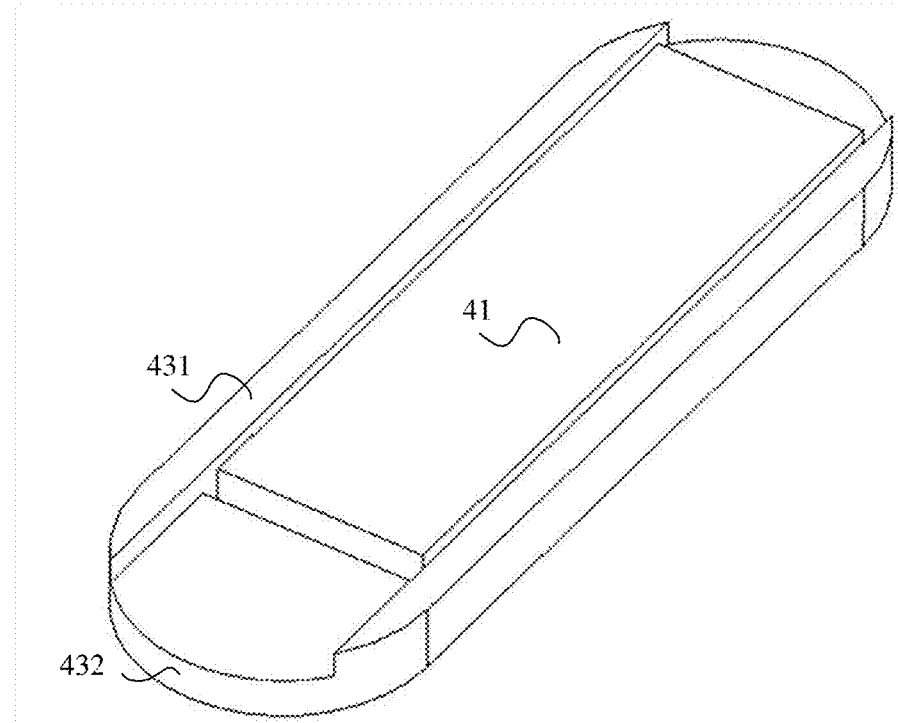
FIG. 15 is a schematic diagram 9 of a chip package structure according to an embodiment of this application.

In this case, one die 41 is used as an example. FIG. 15 is a three-dimensional structural diagram of the package substrate 43 after the die 41 is placed. The second surface 402 of the die 41 is flush with the first substrate 431 of the package substrate 43, and a height of the first substrate 431 is higher than a height of the second substrate 432. Because the area of the through hole 51 is greater than the area of the die 41, after the die 41 is placed, there are gaps between the die 41 and the first substrate 431 and between the die 41 and the second substrate 432. During subsequent molding, an injection molding material may be filled around the die 41 by using the gaps.

Figure 16:
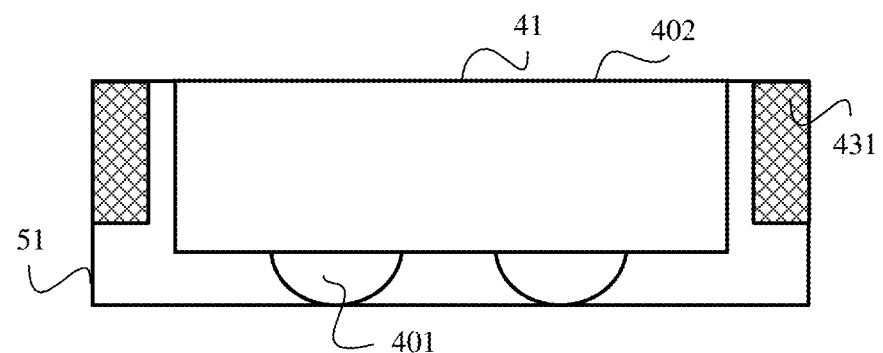
FIG. 16 is a schematic diagram 10 of a chip package structure according to an embodiment of this application.

Still one die 41 is used as an example. FIG. 16 is a cross-sectional view along a dashed line 1201 in FIG. 14. The second surface 402 of the die 41 is flush with the first substrate 431 of the package substrate 43, so that a packaging film is subsequently formed on the first substrate 431 and the second surface that are flush with each other, thereby preventing the injected packaging material from covering the second surface 402 of the die 41.

102. Form a packaging film on the first substrate 431 and the second surface that are flush with each other.

The packaging film may be specifically a high-temperature-resistant film made of a material such as Teflon or polyimide. This is not limited in this embodiment of this application.

Figure 17A:
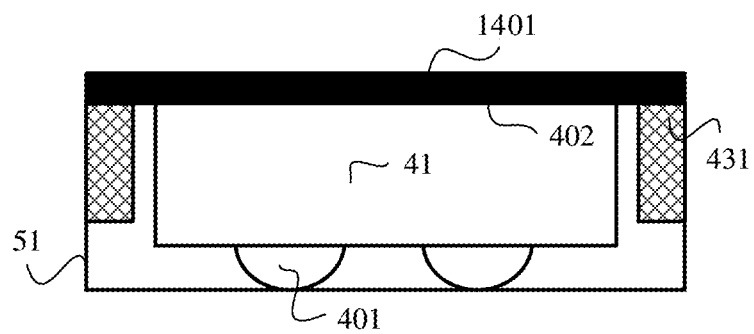
FIG. 17(a) and FIG. 17(b) are a schematic diagram 11 of a chip package structure according to an embodiment of this application.
Figure 17B:
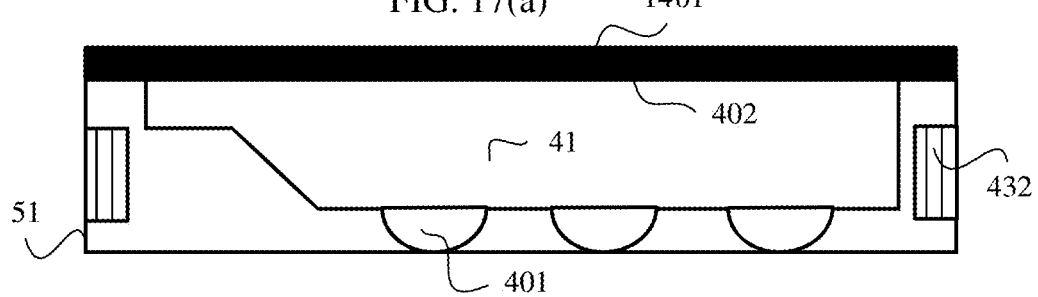

Specifically, FIG. 17(*a*) is a cross-sectional view along the dashed line 1201 in FIG. 14 after the packaging film is formed. Based on FIG. 16, a flat packaging film 1401 is formed on the first substrate 431 and the second surface 402 of the die 41. In this case, the first substrate 431 may support the packaging film 1401, so that the packaging film 1401 and the second surface 402 are bonded to each other, to prevent an injection molding material from being injected onto the second surface 402 during subsequent molding.

In this case, FIG. 17(*b*) is a cross-sectional view along the dashed line 1202 in FIG. 14 after the packaging film is formed. In the package substrate 43, the height of the second substrate 432 is lower than that of the first substrate 431. Therefore, after the packaging film 1401 is formed, the packaging film 1401 and the second surface 402 of the die 41 are bonded to each other, and a gap is formed between the packaging film 1401 and the second substrate 432.

103. Inject an injection molding material into the through hole 51 of the second substrate 432, and the injection molding material covers each surface of the die 41 except the second surface.

Figure 18A:
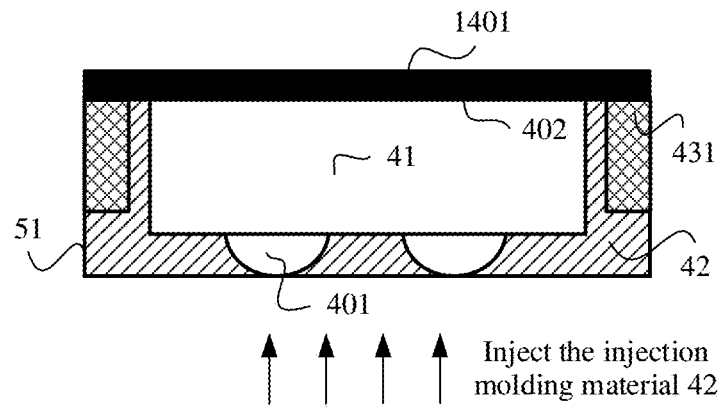
FIG. 18(a) and FIG. 18(b) are a schematic diagram 12 of a chip package structure according to an embodiment of this application.
Figure 18B:
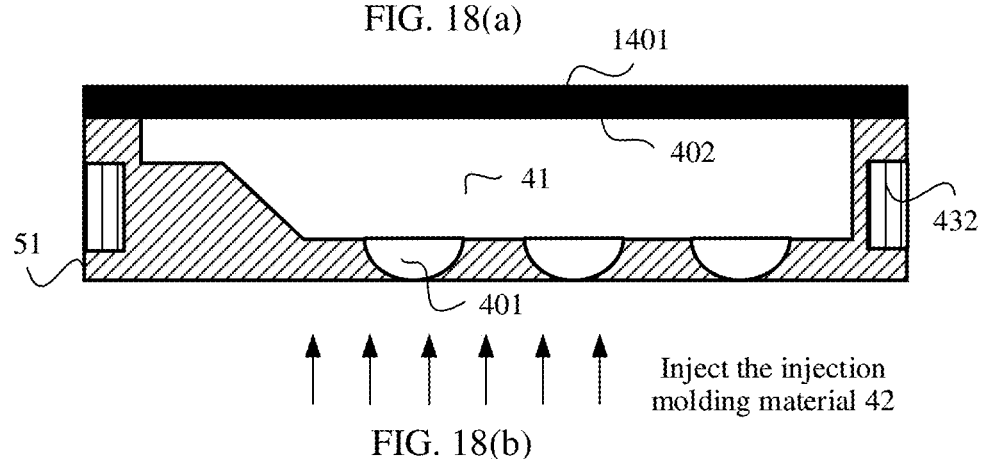

Specifically, FIG. 18(*a*) is a cross-sectional view along the dashed line 1201 in FIG. 14 after the injection molding material is injected. An injection molding material 42 may be injected into the through hole 51 of the second substrate 432 by using a die-casting process, to fill a gap between the die 41 and the first substrate 431. In addition, the injection molding material 42 is formed on the first surface, on which the solder joint 401 is disposed, of the die 41, so that the die 41 exposed in the air is wrapped by the injection molding material 42. Therefore, the die 41 is protected and fastened.

In this case, FIG. 18(*b*) is a cross-sectional view along the dashed line 1202 in FIG. 14 after the injection molding material is injected. In the package substrate 43, the height of the second substrate 432 is lower than that of the first substrate 431. Therefore, when the injection molding material 42 is injected, the plastic packaging material 42 fills a gap between the second substrate 432 and the packaging film 1401, so that the second substrate 432 is embedded in the injection molding material 42.

In this way, the second substrate 432 embedded in the injection molding material 42 is disposed along a pair of opposite sides of the die 41, to fasten the die 41, thereby alleviating warpage that occurs when the die 41 is being packaged.

In addition, because the second substrate 432 is inserted into the injection molding material 42 in an embedded form, a contact area with the injection molding material 42 may be increased, and a buckle structure with relatively high stability may be formed with the injection molding material 42, thereby avoiding separation or detachment between the second substrate 432 and the injection molding material 42. Therefore, stability and reliability of an entire chip package structure are improved.

The injection molding material 42 may be specifically made of materials such as epoxy resin, phenolic resin, benzoxazine resin, cyanate resin, polyimide, bismaleimide, or polyaniline. In addition, a filling agent such as silicon dioxide may be further added to the injection molding material 42. This is not limited in this embodiment of this application.

It may be understood that, when the injection molding material 42 is injected, the solder joint 401 on the first surface of the die 41 needs to be exposed, so that the die 41 subsequently communicates with another component (for example, a mainboard or a processor) in the terminal by using the solder joint 401.

104. Remove the packaging film formed on the first substrate 431 and the second surface.

Figure 19:
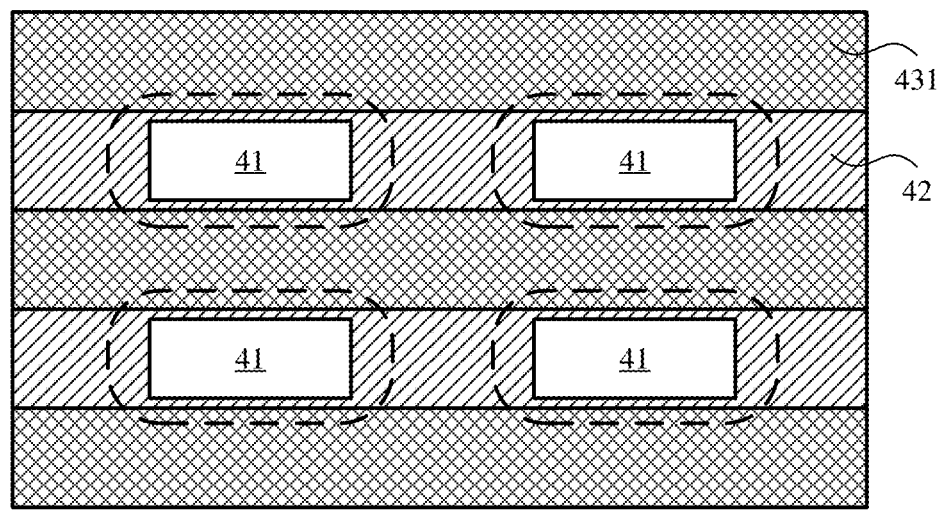
FIG. 19 is a schematic diagram 13 of a chip package structure according to an embodiment of this application.

Specifically, in step 104, the packaging film 1401 formed on the first substrate 431 and the second surface 402 may be removed by using a process such as heating or stripping. In this case, as shown in FIG. 19 (FIG. 19 is a top view of the package substrate 43 after the packaging film 1401 is removed), after the packaging film 1401 is removed, the first substrate 431 and the injection molding material 42 respectively wrap two pairs of opposite sides of each die 41, thereby alleviating easy-detachment of the packaging substrate 43 and warpage.

105. Cut the packaged package substrate 43 to obtain packaged individual chips.

In step 105, the package substrate 43 may be cut based on a specific size and shape and based on an actual requirement or an actual application scenario by using a location of each die 41 on the package substrate 43 as a center, to ensure that a surrounding of each die 41 is wrapped by the first substrate 431 and the injection molding material 42, thereby obtaining packaged individual chips.

Figure 20:
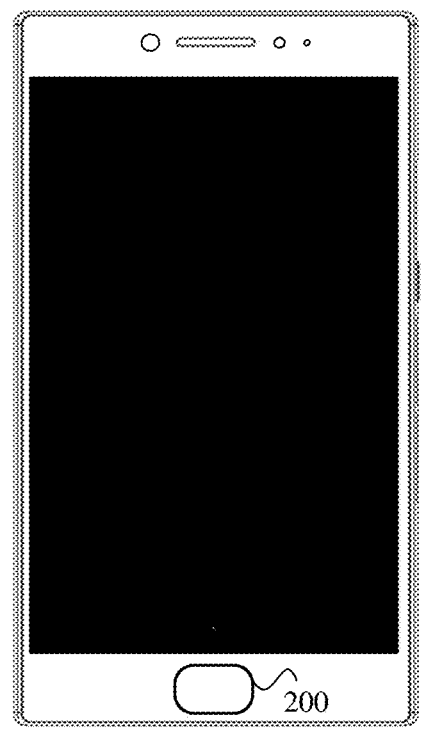
FIG. 20 is a schematic diagram 14 of a chip package structure according to an embodiment of this application.

A fingerprint chip is used as an example. Still as shown in FIG. 19, the package substrate 43 may be cut along a racetrack shape shown by dashed lines in FIG. 19, to obtain a packaged fingerprint chip. Subsequently, the packaged fingerprint chip may be fabricated as the fingerprint module 200 shown in FIG. 2, and integrated into a front panel of a terminal shown in FIG. 20, to implement a fingerprint recognition function of the terminal.

Certainly, the package substrate 43 may be alternatively cut in a shape such as a circle or a rectangle. This is not limited in this embodiment of this application.

Figure 21:
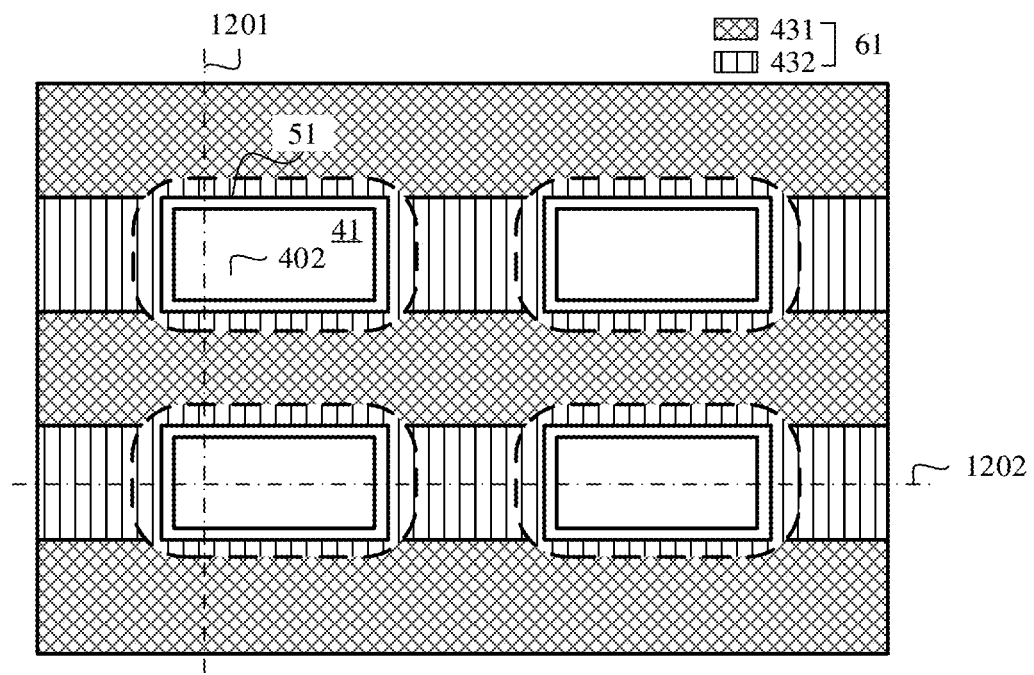
FIG. 21 is a schematic diagram 15 of a chip package structure according to an embodiment of this application.

In some other embodiments of this application, a package substrate used for packaging the die 41 may be further shown in FIG. 21 (FIG. 21 is a top view of another package substrate 61 according to an embodiment of this application). The package substrate 61 still includes a protruded first substrate 431 and a recessed second substrate 432, and a through hole 51 used to package the die 41 is disposed on the second substrate 432.

However, a difference from the package substrate 43 shown in FIG. 14 lies in that, when the package substrate 61 is subsequently cut into individual chips, a cutting boundary line (namely, a closed pattern formed by dashed lines in FIG. 21) includes a second substrate 432 with a lower height.

In this way, the die 41 may still be packaged based on the chip package method described in the steps 101 to 105. A difference is that, after the package film 1401 is formed on the first substrate 431 and the second surface of the die 41 that are flush with each other, as shown in FIG. 22(*a*), which is a cross-sectional view along a dashed line 1201 in FIG. 21 after the packaging film is formed, the die 41 is surrounded by the second substrate 432 with a lower height, so the formed packaging film 1401 is bonded to the second surface 402 of the die 41, but a gap is formed between the formed packaging film 1401 and the second substrate 432.

Figure 22A:
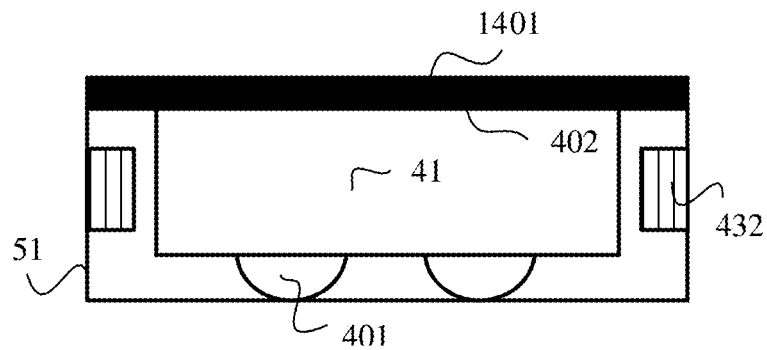
FIG. 22(a) and FIG. 22(b) are a schematic diagram 16 of a chip package structure according to an embodiment of this application.
Figure 22B:
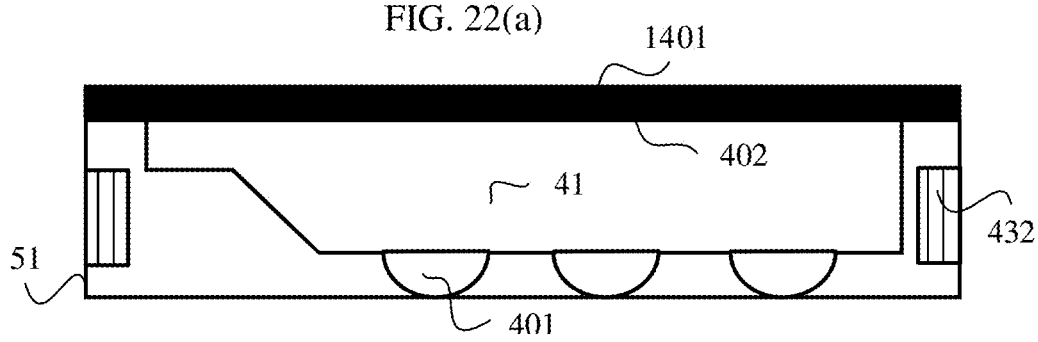

Similarly, FIG. 22(*b*) is a cross-sectional view along a dashed line 1202 in FIG. 21 after the packaging film is formed. After the packaging film 1401 is formed, the packaging film 1401 and the second surface 402 of the die 41 are also bonded to each other, and a gap is also formed between the packaging film 1401 and the second substrate 432.

In this case, when an injection molding material 42 is subsequently injected into the through hole 51 of the second substrate 432, the injection molding material 42 may be injected into the gaps between the packaging film 1401 and the second substrate 432 shown in FIG. 22 (*a*) and FIG. 22 (*b*). In this way, four sides of the package substrate 43 that are disposed around the die 41 are embedded in the injection molding material 42, to finally form the package structure 400 shown in FIG. 4 to FIG. 6, thereby further enhancing stability between the package substrate 43 and the injection molding material 42.

Figure 23:
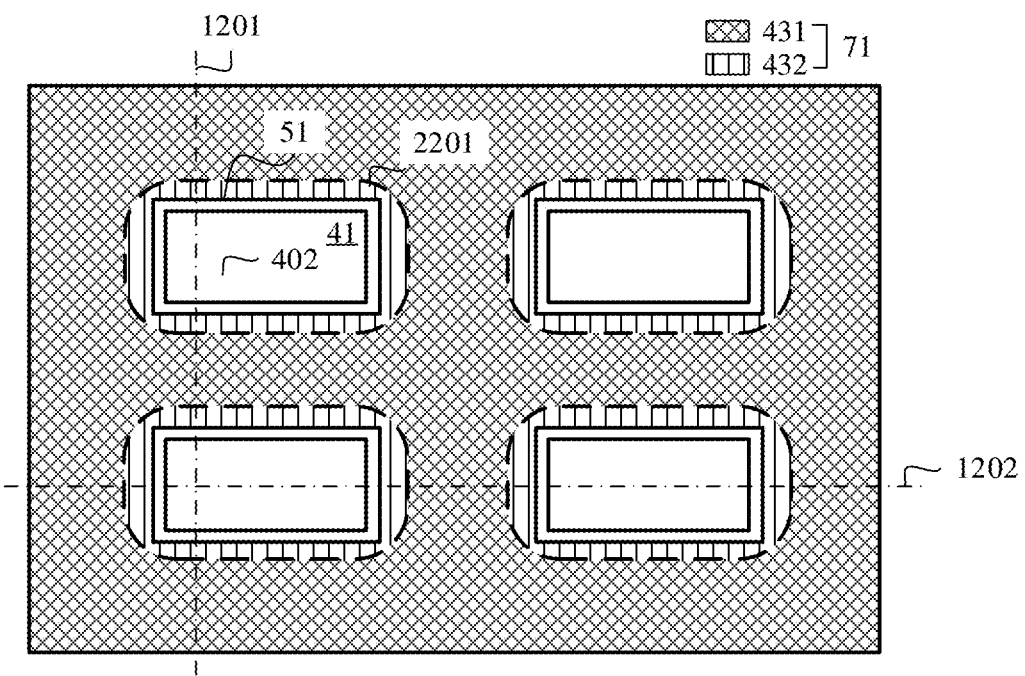
FIG. 23 is a schematic diagram 17 of a chip package structure according to an embodiment of this application.

In some other embodiments of this application, similar to that in FIG. 21, a package substrate used for packaging the die 41 may be further shown in FIG. 23 (FIG. 23 is a top view of another package substrate 71 according to an embodiment of this application). The package substrate 71 still includes a protruded first substrate 431 and a recessed second substrate 432, and a through hole 51 used to package the die 41 is disposed on the second substrate 432.

Different from the package substrate 61 shown in FIG. 21, the second substrate 432 with a lower height is disposed around a cutting boundary line 2201 when the die is cut, and the first substrate 431 with a higher height may be disposed in the remaining area.

In this case, when the die 41 is packaged based on the chip package method described in the steps 101 to 105, similar to that in FIG. 22 (*a*) and FIG. 22 (*b*), the die 41 is surrounded by the second substrate 432 with a lower height. Therefore, after the packaging, the package structure 400 shown in FIG. 4 to FIG. 6 may be finally formed, and stability and reliability of the chip package structure 400 is improved.

In addition, the chip package method described in the steps 101 to 105 may be automatically completed by an injection molding device, and a worker may control the chip package method by setting parameters such as a specific temperature and an injection molding material usage in the injection molding device.

The chip package structure provided in the embodiments of this application may be applied to any terminal on which a chip is disposed, such as a mobile phone, a wearable device, an augmented reality (AR)/virtual reality (VR) device, a tablet computer, a notebook computer, and an ultra-mobile personal computer (UMPC), a netbook, or a personal digital assistant (PDA). This is not limited in the embodiments of this application.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:
1. A chip package structure, comprising:
   a die;
   a package substrate disposed around the die;
   a solder joint is disposed on a first surface of the die; and
   an injection molding material disposed on each surface of the die, other than a second surface of the die, wherein at least one pair of opposite sides of the package substrate is embedded in the injection molding material, wherein each pair of opposite sides of the at least one pair of opposite sides is a pair of portions of the package substrate disposed on opposing sides of the die;
   wherein a contact area between the at least one pair of opposite sides and the injection molding material is greater than half of a surface area of the at least one pair of opposite sides;
   wherein the second surface is opposite the die from the first surface;
   wherein the package substrate comprises a first pair of opposite sides and a second pair of opposite sides, wherein the first pair of opposite sides is a pair of first portions of the package substrate disposed on first opposing sides of the die, wherein the second pair of opposite sides is a pair of second portions of the package substrate that are different from the first portions and that are disposed on second opposing sides of the die different from the first opposing sides of the die;
   wherein a length of the first pair of opposite sides is greater than a length of the second pair of opposite sides;
   wherein the second pair of opposite sides is embedded in the injection molding material such that at least three surfaces of the second pair of opposite sides are in contact with the injection molding material;
   wherein a height of the first pair of opposite sides in a target direction is greater than a height of the second pair of opposite sides in the target direction, and wherein a first target surface of the first pair of opposite sides is flush with the second surface of the die; and wherein the target direction is perpendicular to the second surface of the die, and the first target surface is a surface that is of the first pair of opposite sides and that is not in contact with the injection molding material in the target direction.

2. The chip package structure according to claim 1, wherein the first pair of opposite sides is embedded in the injection molding material such that at least three surfaces of the first pair of opposite sides are in contact with the injection molding material.

3. The chip package structure according to claim 1, wherein a ratio of a contact area between the package substrate and the injection molding material to a surface area of the package substrate is greater than $2/3$, $3/4$, or $4/5$.

4. A chip comprising:
   a chip package structure, comprising:
      a die;
         a package substrate disposed around the die;
         a solder joint disposed on a first surface of the die;
         an injection molding material disposed on each surface the die other than a second surface of the die;
      wherein at least one pair of opposite sides of the package substrate is embedded in the injection molding material, wherein each pair of opposite sides of the at least one pair of opposite sides is a pair of portions of the package substrate disposed on opposing sides of the die;
      wherein a contact area between the at least one pair of opposite sides and the injection molding material is greater than half of a surface area of the at least one pair of opposite sides; and
      wherein the second surface is opposite the die from the first surface;
      wherein the package substrate comprises a first pair of opposite sides and a second pair of opposite sides, wherein the first pair of opposite sides is a pair of first portions of the package substrate disposed on opposing sides of the die, wherein the second pair of opposite sides is a pair of second portions of the package substrate that are different from the first portions and that are disposed on second opposing sides of the die different from the first opposing sides of the die, and wherein a length of the first pair of opposite sides is greater than a length of the second pair of opposite sides;
   wherein the second pair of opposite sides is embedded in the injection molding material such that at least three surfaces of the second pair of opposite sides are in contact with the injection molding material;
   wherein a height of the first pair of opposite sides in a target direction is greater than a height of the second pair of opposite sides in the target direction, and wherein a first target surface of the first pair of opposite sides is flush with the second surface of the die; and
   wherein the target direction is perpendicular to the second surface of the die, and wherein the first target surface is a surface that is of the first pair of opposite sides and that is not in contact with the injection molding material in the target direction.

5. The chip according to claim 4, wherein the first pair of opposite sides is embedded in the injection molding material such that at least three surfaces of the first pair of opposite sides are in contact with the injection molding material.

6. The chip package structure according to claim 4, wherein a ratio of a contact area between the package substrate and the injection molding material to a surface area of the package substrate is greater than $2/3$, $3/4$, or $4/5$.

* * * * *